(12) United States Patent
Li et al.

(10) Patent No.: US 7,960,036 B2
(45) Date of Patent: Jun. 14, 2011

(54) SEMICONDUCTOR STRUCTURE AND METHOD OF MANUFACTURING SAME

(75) Inventors: Wai-Kin Li, Beacon, NY (US); Yi-Hsiung Lin, Taipei (TW); Gerald Matusiewicz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 886 days.

(21) Appl. No.: 11/831,005

(22) Filed: Jul. 31, 2007

(65) Prior Publication Data

US 2009/0035588 A1   Feb. 5, 2009

(51) Int. Cl.
*B32B 9/00* (2006.01)
*B32B 19/00* (2006.01)
*B32B 15/04* (2006.01)

(52) U.S. Cl. ............... 428/689; 428/457; 257/E21.476

(58) Field of Classification Search .................. 428/457, 428/689; 257/E21.476
See application file for complete search history.

(56) References Cited

U.S. PATENT DOCUMENTS

| | | | |
|---|---|---|---|
| 4,920,403 A | 4/1990 | Chow et al. | |
| 5,262,354 A | 11/1993 | Cote et al. | |
| 5,420,069 A | 5/1995 | Joshi et al. | |
| 7,118,966 B2 | 10/2006 | Southwick et al. | |
| 2002/0142605 A1 | 10/2002 | Kim | |
| 2003/0089928 A1 | 5/2003 | Saito et al. | |
| 2006/0141781 A1 | 6/2006 | Lee | |

FOREIGN PATENT DOCUMENTS

| | | |
|---|---|---|
| CN | 1359536 | 7/2002 |
| CN | 1364311 | 8/2002 |
| CN | 1420560 | 5/2003 |
| JP | 2005152448 | 6/1993 |
| JP | 2001023983 | 1/2001 |

OTHER PUBLICATIONS

Office Action for corresponding Chinese Application No. 200810144702.1.

*Primary Examiner* — Timothy M Speer
*Assistant Examiner* — Jonathan C Langman
(74) *Attorney, Agent, or Firm* — Jennifer R. Davis; Roberts Mlotkowski Safran & Cole, P.C.

(57) ABSTRACT

A semiconductor structure and method of manufacturing the semiconductor structure, and more particularly to a semiconductor structure having reduced metal line resistance and a method of manufacturing the same in back end of line (BEOL) processes. The method includes forming a first trench extending to a lower metal layer Mx+1 and forming a second trench remote from the first trench. The method further includes filling the first trench and the second trench with conductive material. The conductive material in the second trench forms a vertical wiring line extending orthogonally and in electrical contact with an upper wiring layer and electrically isolated from lower metal layers including the lower metal layer Mx+1. The vertical wiring line decreases a resistance of a structure.

14 Claims, 8 Drawing Sheets

SEMICONDUCTOR STRUCTURE AND METHOD OF MANUFACTURING SAME

FIELD OF THE INVENTION

The invention relates to a semiconductor structure and method of manufacturing the semiconductor structure and, more particularly, to a semiconductor structure having reduced metal line resistance and a method of manufacturing the same in back end of line (BEOL) processes.

BACKGROUND DESCRIPTION

The strategy of enhancing the function of an integrated circuit by reducing its critical dimensions, known as scaling, has been a key to faster performance and more densely packed integrated circuits. However, as semiconductor devices continue to become smaller in size, the devices must continue to be able to be made with reduced dimensions and still function at the required specifications.

As the device dimensions shrink, problems arise which need to be addressed. These problems, for example, include high resistances and capacitances within the device which, in turn, contribute to delay problems.

By way of example, in 70 nanometer technology, high resistance is directly attributable to, amongst other features, the narrow dimensions of the vertical metal lines which connect metal on different layers, Mx and Mx+1. In a typical device using such technology, the metal lines are on the order of sub micron sizes, e.g., 1/10 of a micron in height. This reduced size results in less metal within the device and, hence, an increase in the overall resistance of the device. Also, at these dimensions, electron scattering from sidewalls and grain boundaries adds significantly to the resistance of the metal interconnect.

Accordingly, there exists a need in the art to overcome the deficiencies and limitations described hereinabove.

SUMMARY OF THE INVENTION

In a first aspect of the invention, a method comprises forming a first trench extending to a lower metal layer Mx+1 and forming a second trench remote from the first trench. The method further includes filling the first trench and the second trench with conductive material. The conductive material in the second trench forms a vertical wiring line extending orthogonally and in electrical contact with an upper wiring layer and electrically isolated from lower metal layers including the lower metal layer Mx+1. The vertical wiring line decreases a resistance of a structure.

In another aspect of the invention, the method of forming a structure comprises forming vias in a photoresist in alignment with a metal layer Mx+1 and remote from the wiring layer Mx+1. The method further includes etching layers in the structure in alignment with the vias to form a first trench in alignment and extending to the metal layer Mx+1 and at least a second trench isolated from the metal layer Mx+1. The first trench and the at least second trench are simultaneously filled the conductive material. The conductive material in the first trench is in electrical contact with the metal layer Mx+1 and the conductive material in the at least second trench forms a vertically extending wiring line electrically isolated from the metal layer Mx+1 and any other metal layer below the at least second trench. The filling of the first trench and the second trench form upper wiring layers, one of which is orthogonal to and in electrical contact with the vertically extending wiring line.

In yet another aspect of the invention, a structure comprises a first metal layer Mx formed in a lower dielectric layer and a second metal layer Mx+1 above the first metal layer Mx and formed in an intermediate dielectric layer. A metal line extends to and is in electrical contact with the second metal layer Mx+1. A second metal line is electrically isolated from the first metal layer Mx and the second metal layer Mx+1 and extends from an upper metal layer formed in the upper dielectric layer.

DETAILED DESCRIPTION OF EMBODIMENTS OF THE INVENTION

The invention relates to a semiconductor structure and method of manufacturing the semiconductor structure. More specifically, the invention relates to a semiconductor structure having reduced metal line resistance and a method of manufacturing the same in back end of line (BEOL) processes. By implementing the invention, it is possible to reduce the metal line resistance in a semiconductor device and, as such, decrease any delays in such device. In embodiments, the metal line resistance is reduced by fabricating metal via bars (and other shapes) in a vertical direction to increase the number and size of the metal lines in the device. The increase in the size and number of vertical metal lines effectively decreases the resistance of the device and, hence, decreases delays.

Figure 1:
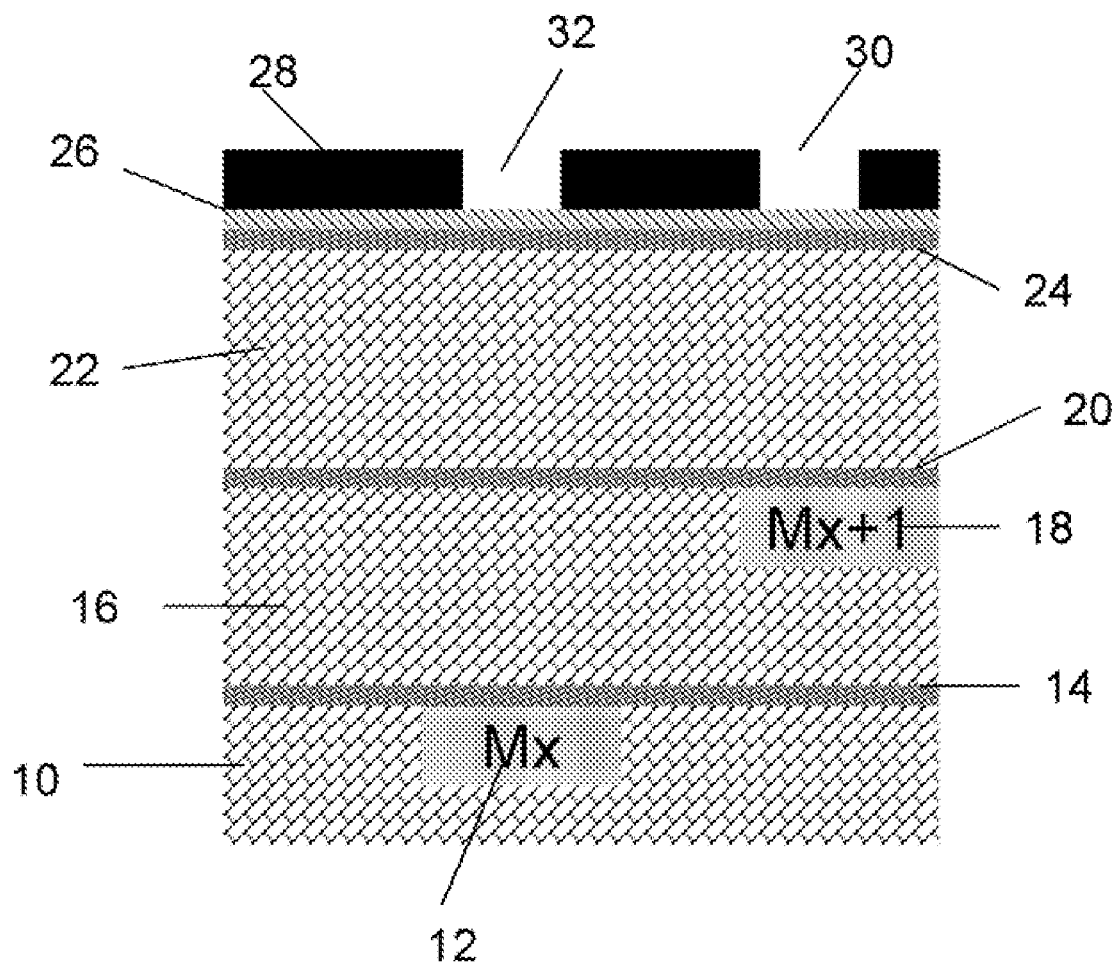
FIG. 1 is representative of a starting structure and related processes in accordance with the invention.

FIG. 1 is representative of a starting structure in accordance with processes of the invention. The starting structure can be fabricated in any conventional manner as should be understood by those of skill in the art. By way of example, the beginning structure includes a lower interlevel dielectric (ILD) layer 10 with a metal layer Mx, 12, formed therein. The lower ILD layer 10 can be any known dielectric material for particular applications such as SICOH, SiLK, SiO$_2$, etc., amongst other materials contemplated by the invention. The metal layer Mx, 12, can be formed in the ILD layer 10 using any conventional processes such as, for example, a photoresist exposure process to pattern a trench a deposition process to deposit metal within the trench and a polishing process such as CMP (chemical mechanical polishing) to planarize the surface for future processing steps.

Still referring to FIG. 1, a capping layer 14 is deposited over the ILD layer 10 and metal layer Mx, 12. The capping layer 14 may be, for example, SiCN, SiO2, or Si$_3$N$_4$, amongst other materials contemplated by the invention. An intermediate ILD layer 16 is formed over the capping layer 14. Much like the lower ILD layer 10, the intermediate ILD layer 16 may be any known dielectric material for particular applications such as SICOH, SiLK, SiO$_2$, etc. A metal layer Mx+1, 18, is formed in the intermediate ILD layer 16, in the manner as discussed above, for example. A capping layer 20 is then formed over the intermediate ILD layer 16 and metal layer Mx+1, 18, similar to the processes as discussed above, for example.

Thereafter, a top ILD layer 22 is formed over the capping layer 20. Much like the other ILD layers, the top ILD layer 22 may be any known dielectric material for particular applications such as SICOH, SiLK, $SiO_2$, etc. A capping layer 24 is formed over the top ILD layer 22. The capping layer 24, much like the other capping layers, may be, for example, SiCN, SiO2, or $Si_3N_4$, amongst other materials contemplated by the invention.

A hardmask 26 of anti-reflective material is formed over the capping layer 26. In alternative embodiments, the hardmask 26 is not essential to the fabrication method in accordance with the invention. A photoresist 28 is formed over the structure with vias patterned therein in a conventional exposure process. In this embodiment, a conventional via 30 is aligned with the metal layer Mx+1, 18 and, in accordance with the invention, at least another via 32 is patterned in the photoresist 28. It should be understood that the invention contemplates the formation of multiple additional vias, depending on the design criteria of the device. As will be understood more readily from the below description, the at least another via 32 is used to form additional vertical metal lines to reduce overall metal line resistance in the device.

Figure 2:
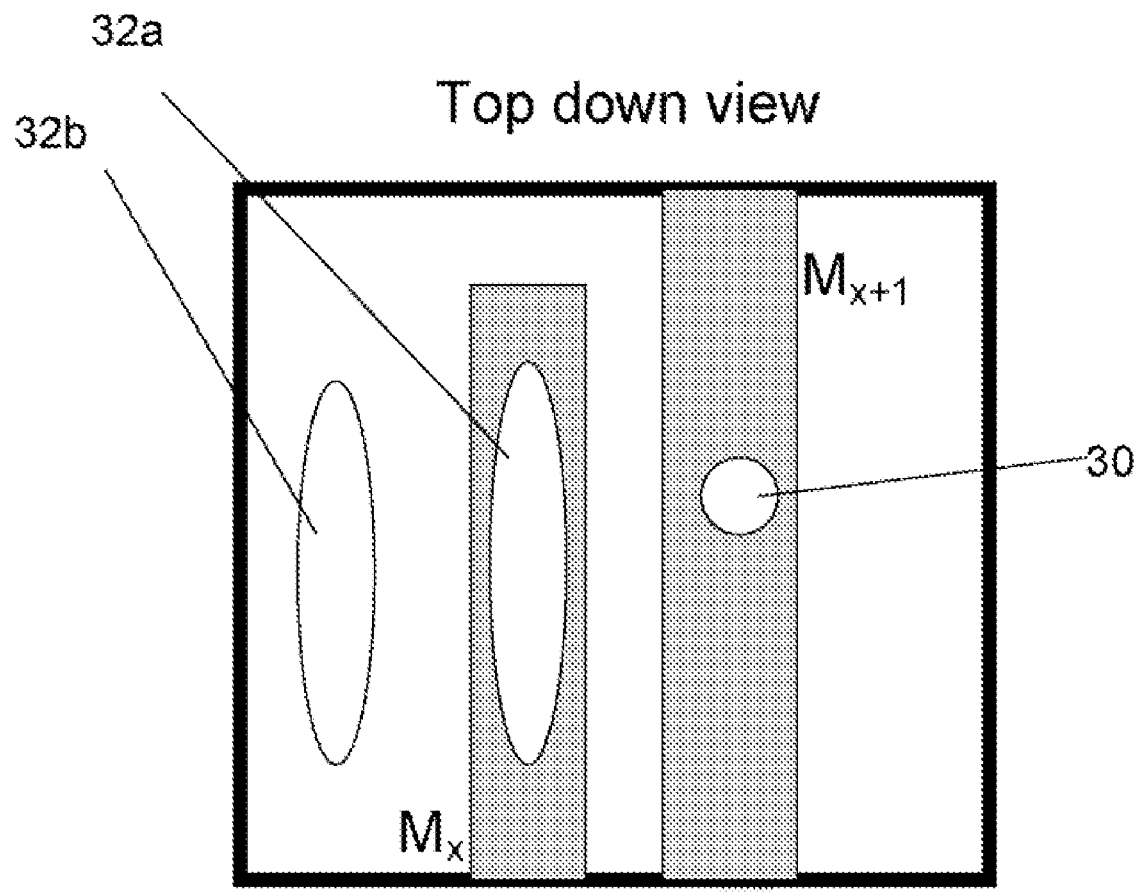
FIG. 2 shows a top down view of a starting structure in accordance with the invention.

FIG. 2 shows a top down view of a starting structure of FIG. 1. In this embodiment, at least two additional vias 32 are formed in the structure. As shown, the vias 32 are elongated structures to increase the overall size thereof. The increase in the size of the vias will, in turn, be used for trenches filled with conductive material to reduce the overall resistance of the metal in the device. The vias 32 are of a different shape than the conventional via 30. The different shape of the vias 32 will result in a different shape metal line, e.g., a metal bar or elongated shape.

As further shown in FIG. 2, the via 32a may be aligned with the metal layer Mx. In addition, another via 32b may be remote from any other metal line or lower metal layer, which allows the subsequently formed vertical line, in embodiments, to be formed deeper into the structure. The position of via 32b, in turn, will increase the overall size of the vertical metal line and thus reduce its resistance. Moreover, by forming the vias remote from the metal layer Mx, there is a greater possibility of reducing high electron fields between the metal layer Mx and any formed vertical metal line.

Figure 3:
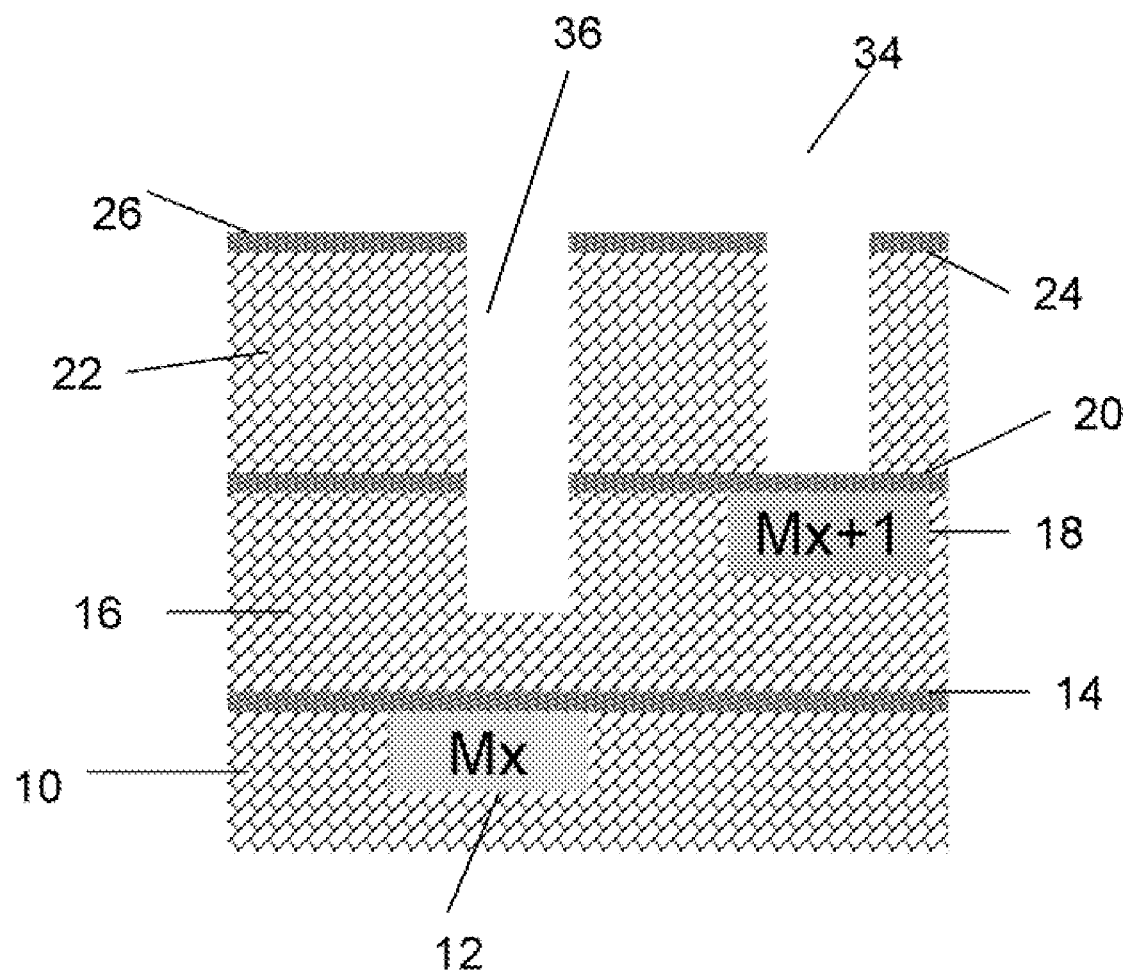
FIG. 3 represents an intermediate structure and related processing in accordance with the invention.

FIG. 3 represents an intermediate structure and related processing in accordance with the invention. In this processing, trenches 34, 36 are etched into the structure by way of conventional RIE (reactive ion etching) processes. The RIE will also etch away the photoresist and antireflective coating shown in FIG. 1. In embodiments, the trench 34 is etched to the metal layer Mx+1.

In embodiments, the depth of the trench 36 is preferably about the depth of a lower portion of the metal layer Mx+1; although other depths are contemplated by the invention. By way of further examples, the depth of the trench 36 is about 0.2 to 0.3 microns for 70 nanometer technologies. In further embodiments, the depth of the trench 36 is limited only by subsequent lining processes. By way of a non-limiting example, the depth can be any depth which allows subsequent lining processes to line the sidewalls and bottom of the trench 36. Thus, the trench should not be so narrow and/or deep as to not permit lining of the sidewalls and bottom, all of which are dependent on the particular lining processes implemented for a particular application.

Moreover, as a further consideration, the bottom of the trench 36 should not be too close to the metal layer Mx so as to cause high electron fields, as should be understood by those of skill in the art. As yet another consideration, the trench 36 should not be formed so as to compromise the reliability and structural integrity of the structure.

Figure 4:
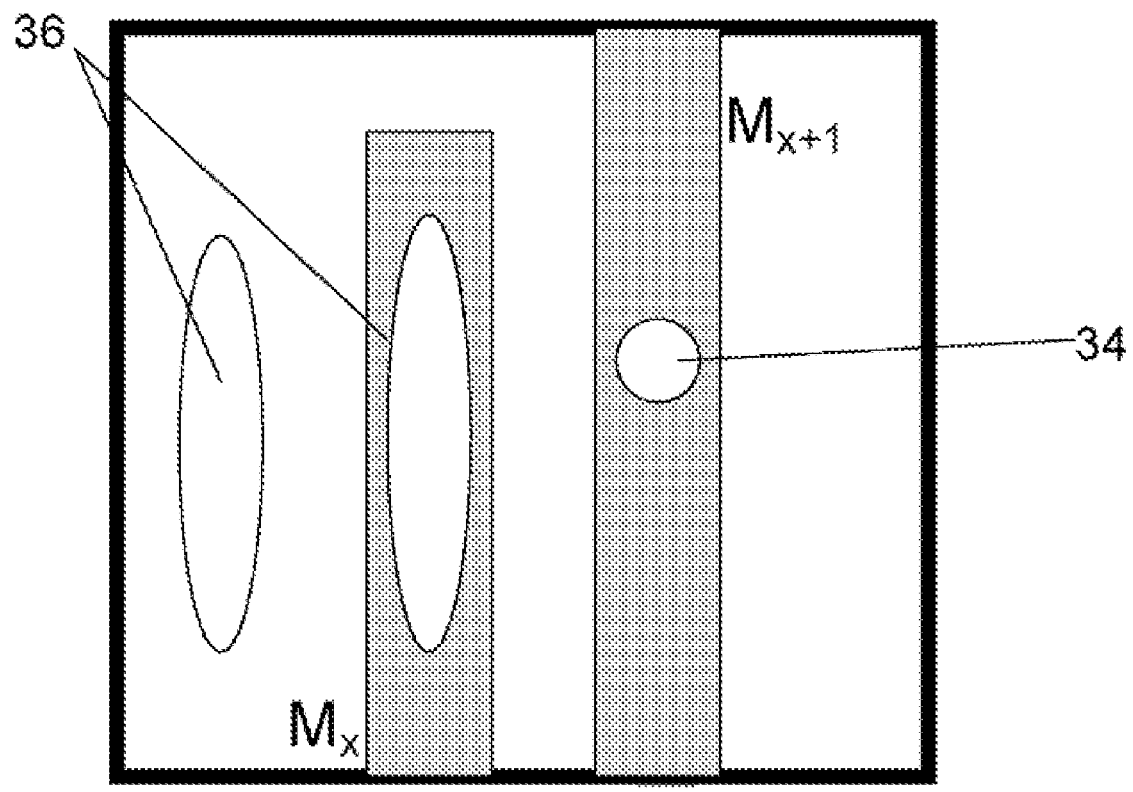
FIG. 4 shows a top down view of an intermediate structure in accordance with the invention.

FIG. 4 shows a top down view of an intermediate structure in accordance with processes of the invention. In this intermediate structure, two trenches 36 are shown, which are elongated in the horizontal direction with respect to the metal layers Mx, Mx+1, etc. Again, the elongated structures permit more metal to be deposited into the trenches, in subsequent processing steps, thereby forming the vertical metal lines in accordance with the invention. The additional metal will reduce the overall resistance of the device. As one of skill in the art should now realize, one or more of the elongated structures (or other desired shapes) can be implemented in accordance with the invention.

Figure 5:
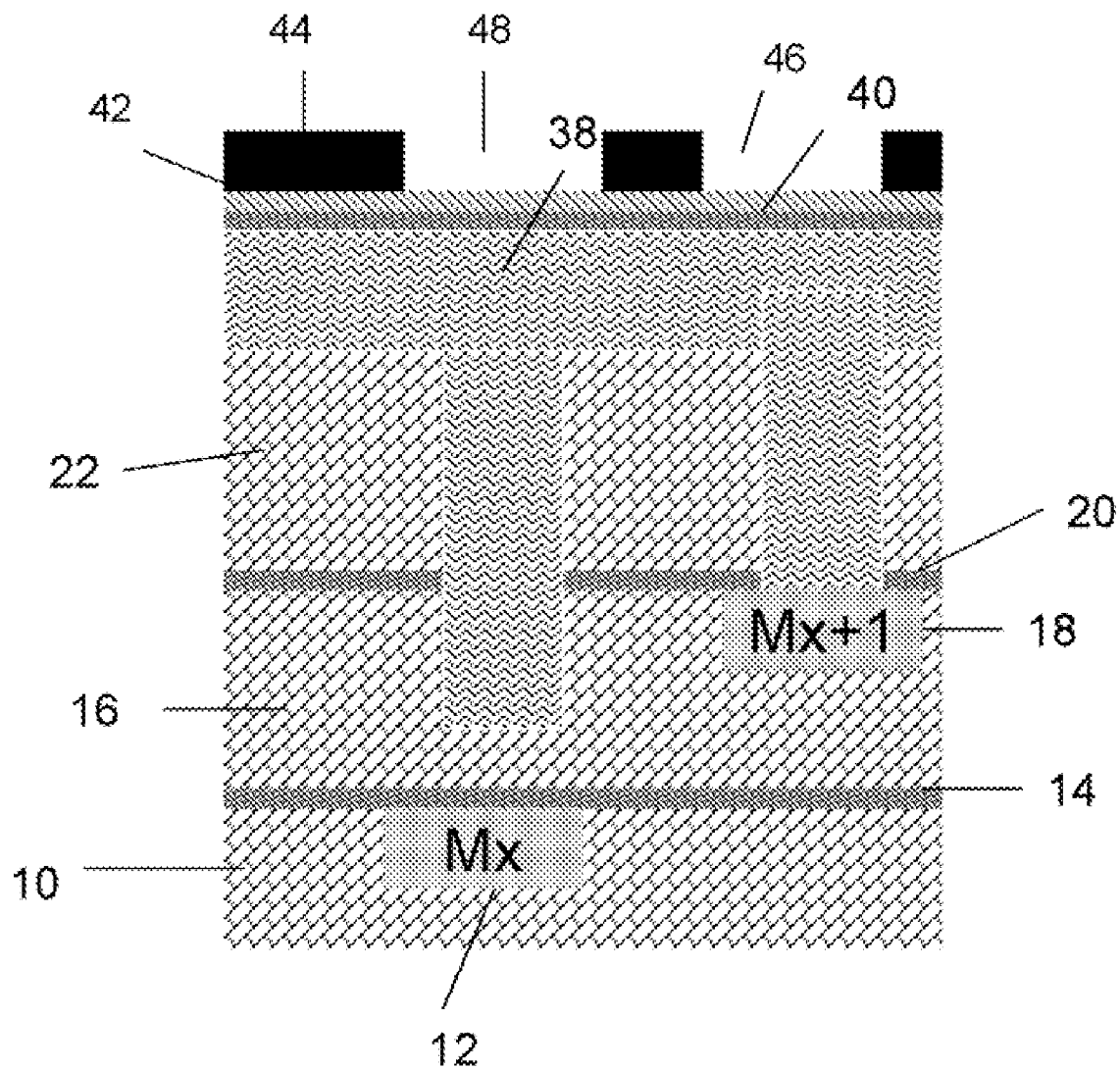
FIGS. 5 and 6 represent intermediate structures and relating processing in accordance with the invention.

In FIG. 5, a filler material 38 is deposited within the trenches 34, 36 and over the surface of the structure. The filler material 38 may be any organic polymer material used in semiconductor manufacturing processes. The filler material 38 is used, in embodiments, to provide a planar surface for subsequent processing. By example, a capping layer 40 and antireflective coating layer 42 are deposited over the filler material 38. Subsequently, a photoresist material 44 is deposited over the antireflective coating layer 42, which is exposed and developed to form a pattern. As seen, the pattern, e.g., vias 46 and 48, are aligned with the trenches 34, 36, previously formed and filled with the filler material.

Figure 6:
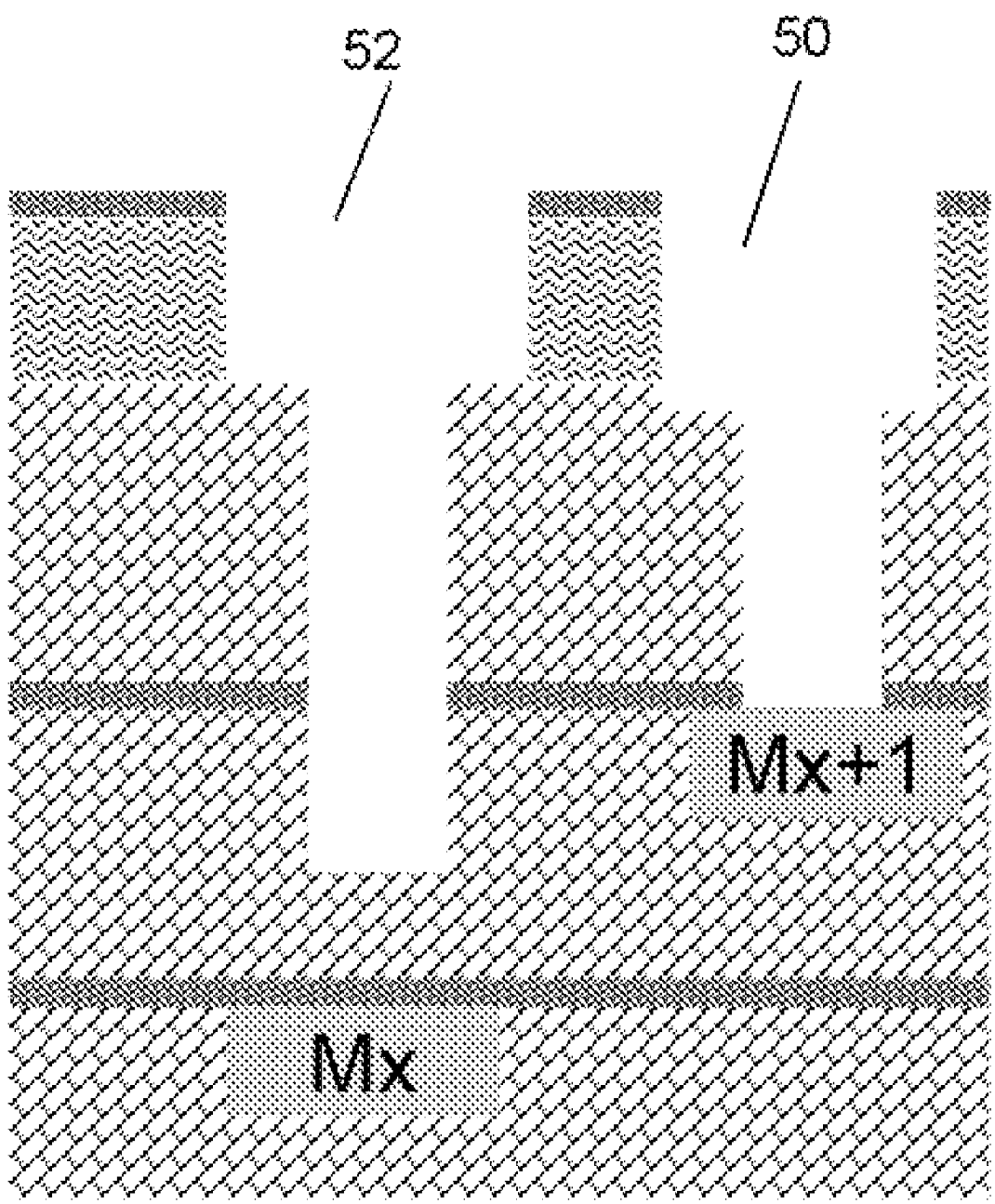

In FIG. 6, the structure is etched using a conventional RIE process. In the process of etching, self aligned trenches 50 and 52 are formed over the previously formed trenches 34, 36.

Figure 7:
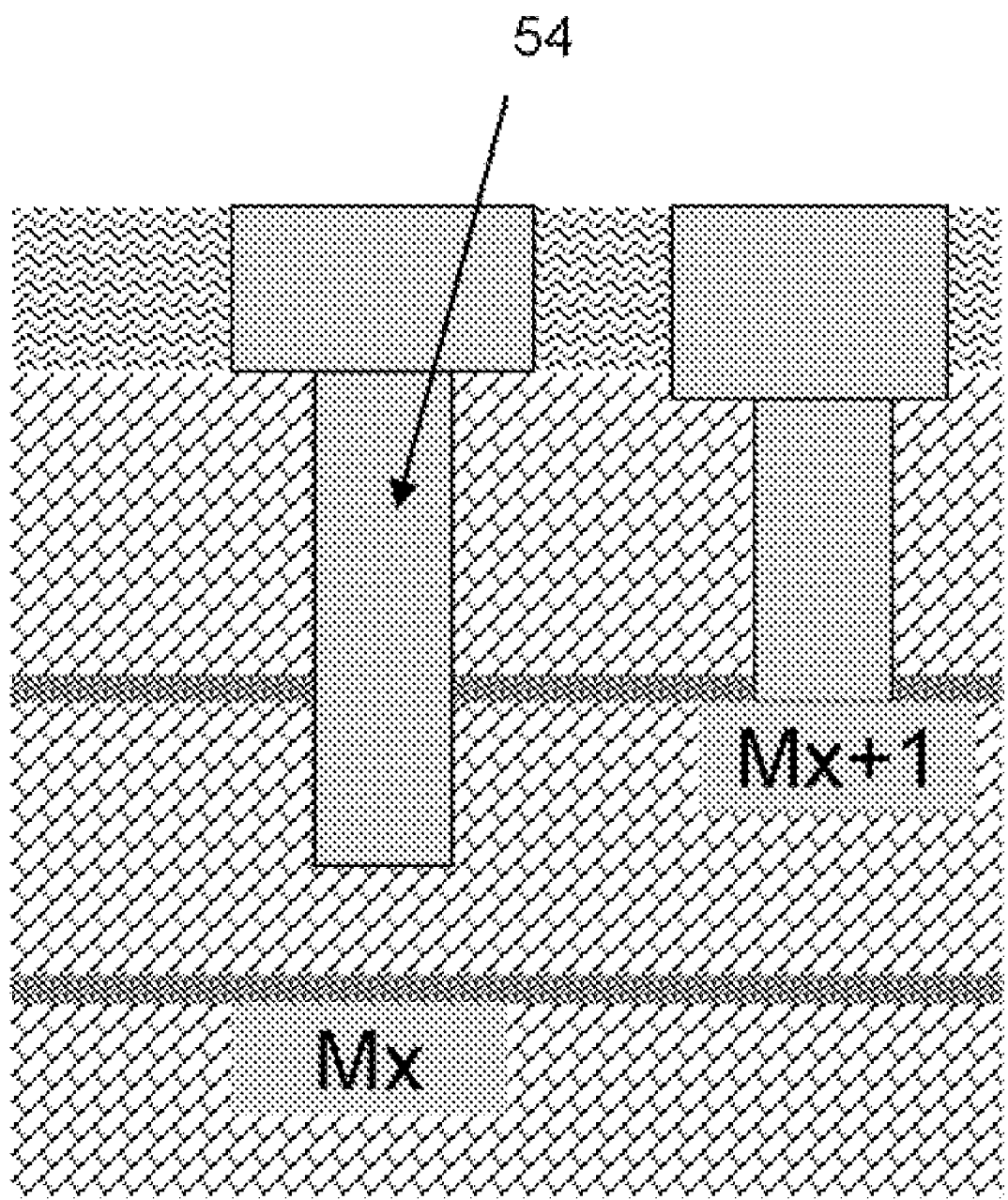
FIG. 7 shows a final structure and relating processing in accordance with the invention.

FIG. 7 shows a final structure and related processing in accordance with the invention. More specifically, FIG. 7 is representative of metallization and post metallization processes. In FIG. 7, the vias and trenches are filled with metal 54 in a conventional manner. By way of one illustrative non-limiting example, a deposition of a thin layer of material is first formed in the vias and trenches. The materials for the liner may be, but not limited to, Tantalum Nitride and Tantalum. A thin layer of copper is then deposited over the liner, followed by electroplating with the copper to fill the remaining portions of the trenches and vias. The structure is then polished using CMP.

As should now be understood, at least one additional vertical metal line 54 is formed within the structure according to the above processes. The vertical metal line 54 can be of various shapes, preferably an elongated bar, which contributes to a decrease in the resistance of the device. The at least one additional vertical metal line 54 extends below and is in contact with an upper metal layer Mx+2, while being electrically isolated from lower metal layers, Mx, Mx+1, etc. The metal line 54, as is described herein, may be formed simultaneously with the upper metal layer Mx+2. It should be understood that this same process and structure can be used for additional layers within the device.

In embodiments, the height of the vertical metal line 54, in embodiments, is about 0.2 to 0.3 microns for 70 nanometer technologies. In further embodiments, the height of the vertical metal line 54 is limited only by the lining processes. By way of example, the height of the vertical metal line 54 can be any height which allows subsequent lining processes to adequately line the sidewalls and bottom of the trench when forming the vertical metal line. As a further consideration, the bottom of the vertical metal line 54 should not be too close to the metal layer Mx (or other lower metal layers, depending on the particular layer in which the vertical metal line is formed) so as to cause high electron fields.

Figure 8:
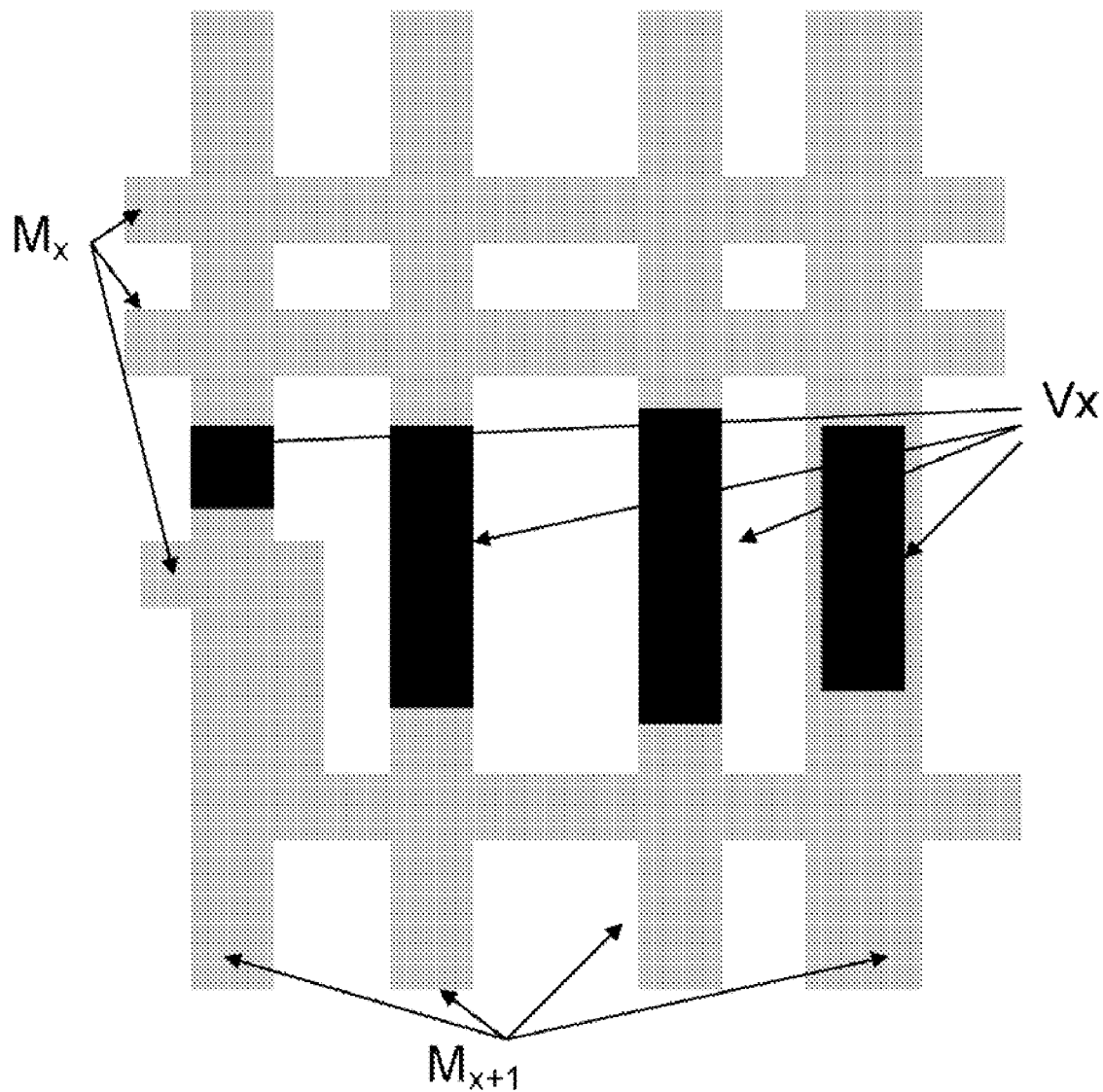
FIG. 8 shows an embodiment in accordance with the invention.

As shown in FIG. 8, the metal lines (represented generally by "Vx") may be longer in length in areas where the metal layers Mx and Mx+1 are further spaced apart from one another. Likewise, shorter in length metal vertical metal lines are provided in areas where the metal layers Mx and Mx+1 are closer to one another. The vertical metal lines may also be of a different shape than the metal lines extending to the wiring layer Mx+1.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

The invention claimed is:

1. A structure comprising:
a first metal layer Mx formed in a lower dielectric layer;
a second metal layer Mx+1 above the first metal layer Mx and formed in an intermediate dielectric layer;
a metal line extending to and in electrical contact with the second metal layer Mx+1; and
a second metal line electrically isolated from the first metal layer Mx and the second metal layer Mx+1 and extending from an upper metal layer formed in an upper dielectric layer to a depth of at least a lower portion of the second metal layer Mx+1 and above the first metal layer Mx,
wherein the second metal line is of a different shape than the metal line and the upper metal layer includes two metal layers, one of which is in electrical contact with the second metal layer Mx+1 via the metal line, and
wherein the different shape is a shape elongated in a horizontal direction with respect to the first metal layer Mx and the second metal layer Mx+1, from a top down view.

2. The structure of claim 1, wherein the first metal layer, the second metal layer, the metal line, and the second metal line comprise a tantalum nitride or tantalum layer, a copper layer, and a copper filling.

3. The structure of claim 1, further comprising a filler material formed on the upper dielectric layer to provide a planar surface for subsequent processing, the filler material comprising an organic polymer material.

4. The structure of claim 3, further comprising:
a capping layer formed on the filler material and comprising SiCN, SiO$_2$, or Si$_3$N$_4$;
an antireflective coating layer formed on the capping layer; and
a photoresist material formed on the antireflective coating layer comprising vias aligned with the first metal line, the second metal line, and the two metal layers.

5. The structure of claim 3, wherein the two metal layers are formed in the filler material.

6. The structure of claim 1, wherein the second metal line extends to a depth in at least the intermediate dielectric layer.

7. The structure of claim 1, further comprising:
a first capping layer between the lower dielectric layer and the intermediate dielectric layer; and
a second capping layer between the intermediate dielectric layer and the upper dielectric layer,
wherein the first capping layer and the second capping layer comprise SiCN, SiO$_2$, or Si$_3$N$_4$.

8. A structure comprising:
a first metal layer Mx formed in a lower dielectric layer;
a second metal layer Mx+1 above the first metal layer Mx and formed in an intermediate dielectric layer;
a metal line extending to and in electrical contact with the second metal layer Mx+1; and
a second metal line electrically isolated from the first metal layer Mx and the second metal layer Mx+1 and extending from an upper metal layer formed in an upper dielectric layer to a depth in at least the intermediate dielectric layer and above the first metal layer Mx,
wherein the second metal line is of a different shape than the metal line and the upper metal layer includes two metal layers, one of which is in electrical contact with the second metal layer Mx+1 via the metal line, and
wherein the different shape is a shape elongated in a horizontal direction with respect to the first metal layer Mx and the second metal layer Mx+1, from a top down view.

9. The structure of claim 8, wherein the first metal layer, the second metal layer, the metal line, and the second metal line comprise a tantalum nitride or tantalum layer, a copper layer, and a copper filling.

10. The structure of claim 8, further comprising a filler material formed on the upper dielectric layer to provide a planar surface for subsequent processing, the filler material comprising an organic polymer material.

11. The structure of claim 10, further comprising:
a capping layer formed on the filler material and comprising SiCN, SiO$_2$, or Si$_3$N$_4$;
an antireflective coating layer formed on the capping layer; and
a photoresist material formed on the antireflective coating layer comprising vias aligned with the first metal line, the second metal line, and the two metal layers.

12. The structure of claim 10, wherein the two metal layers are formed in the filler material.

13. The structure of claim 8, wherein the second metal line extends to a depth of at least a lower portion of the second metal layer Mx+1.

14. The structure of claim 8, further comprising:
a first capping layer between the lower dielectric layer and the intermediate dielectric layer; and
a second capping layer between the intermediate dielectric layer and the upper dielectric layer,
wherein the first capping layer and the second capping layer comprise SiCN, SiO$_2$, or Si$_3$N$_4$.

* * * * *